CRYSTAL-CONTROLLED TRANSISTOR OSCILLATORS OR THE LIKE

Filed April 22, 1954

KARL E. PIERSON
EUGENE D. MENG
INVENTORS

BY Bruce Richard

THEIR ATTORNEY

United States Patent Office 2,755,384

Patented July 17, 1956

2,755,384

CRYSTAL-CONTROLLED TRANSISTOR OSCILLATORS OR THE LIKE

Karl E. Pierson, Los Angeles, and Eugene D. Meng, Torrance, Calif., assignors to Hoffman Electronics Corporation, a corporation of California Application April 22, 1954, Serial No. 424,845

4 Claims. (Cl. 250—36)

This invention is related to crystal-controlled oscillators employing transistors and, more particularly, to an improved crystal-controlled transistor oscillator which will exhibit performance which is independent, to all intent and purposes, of crystal factor of merit, or "Q," at the crystal resonant frequency.

In the past many attempts have been made to design crystal-controlled oscillators employing transistors. Invariably certain problems are encountered which render crystal-controlled transistor oscillators presently in use deficient in some respect. The principal difficulty lies in the fact that conventional crystal-controlled oscillators employing transistors exhibit characteristics which depend to a great extent upon the "Q" of the particular crystal being used, and also upon transistor parameters.

Therefore, it is an object of this invention to provide an improved crystal-controlled oscillator circuit employing transistors.

It is a further object of this invention to provide an improved crystal-controlled transistor oscillator, the performance of which is independent of crystal "Q" and variation in transistor parameters.

According to this invention a transistor oscillator having a tank circuit in the transistor collector circuit employs a crystal in the feedback circuit which, at series resonance, provides regenerative feedback to the base side of the transistor. The oscillator tank circuit exhibits a low factor of merit, or "Q," and is tuned slightly below the crystal frequency so as to provide feedback having the requisite phase relationship for regeneration.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
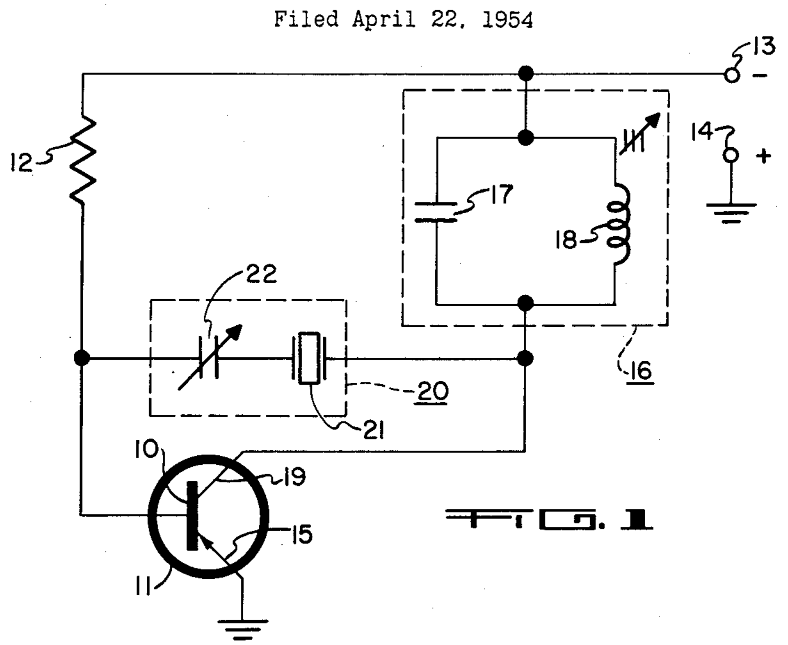
Figure 1 is a basic schematic diagram of a crystal-controlled transistor oscillator.

In Figure 1, base 10 of transistor 11 is connected through bias resistor 12 to negative voltage terminal 13. Positive voltage terminal 14 is grounded, as is also emitter 15 of transistor 11. Parallel resonant circuit 16, consisting of capacitor 17 and variable inductor 18, is connected between negative voltage terminal 13 and collector 19 of transistor 11. Regenerative feedback circuit 20, consisting of crystal 21 and variable capacitor 22, is connected between collector 19 and base 10 of transistor 11. Capacitor 22 is inserted in the feedback circuit for the purpose of minor frequency adjustment, in order to adapt the oscillator circuit to a variety of uses.

The circuit of Figure 1 operates as follows. Variable inductor 18 is chosen to have a relatively low factor of merit, or "Q." Parallel resonant circuit 16 is tuned by the appropriate adjustment of inductor 18 to a frequency which is slightly less than the resonant frequency of crystal 21. This provides, effectively, a capacitive load for the collector circuit of transistor 11. This effective capacitive load affords a shift in phase of the feedback voltage such that, when the feedback is applied to the input side of transistor 11, oscillations are sustained. Crystal 21 in conjunction with variable capacitor 22 serves as a series resonant circuit to supply a maximum current transfer to the low impedance input side of transistor 11. In operating at series resonance, the crystal exhibits low impedance at the crystal frequency so that reasonable variations in "Q" between the various crystals selected as crystal 21 will have little effect, if any, upon the desired regeneration and sustained oscillations.

At this point consideration should be taken of the familiar equation $$\beta \cong \frac{(1-a)}{a}$$

where $\beta$ is the feedback ratio and $a$ is the short-circuit current gain. At high frequencies $a$ becomes a complex expression, and so $\beta$ must also be complex, to satisfy the above equation. Hence, there will be an optimum "Q" for variable inductor 18 at which the resistive-capacitive load will insure a proper phase relationship between the output current and the current fed back into the base side of transistor 11, and maximum for oscillation strength at the crystal frequency.

Figure 2:
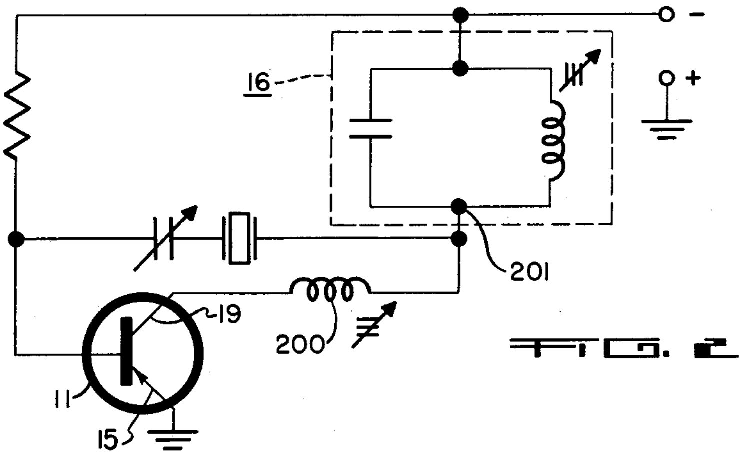
Figure 2 is a schematic diagram of a first modification of the crystal-controlled oscillator circuit shown in Figure 1.

The circuit of Figure 2 is a first modification of the circuit shown in Figure 1, this modification covering the inclusion of reactor 200 between collector 19 of transistor 11 and terminal 201 of parallel resonant circuit 16.

The circuit including reactor 200 operates as follows. Owing to the fact that during the negative half-cycles of the oscillator output signal the base current is at its maximum and the base-to-emitter impedance is at its minimum, which in effect grounds the input signal, clipping of the output negative half-cycles will occur, resulting in increased harmonic content of the output signal during its negative half-cycles and also an amplified D. C. potential on the transistor base terminal. Reactor 200, which may be made variable, is included in the circuit of Figure 2 to increase the harmonic content of the positive half-cycles of the output signal in order that the oscillator, in having an output rich in harmonics over the complete cycle, may serve as a reliable harmonic generator.

Figure 3:
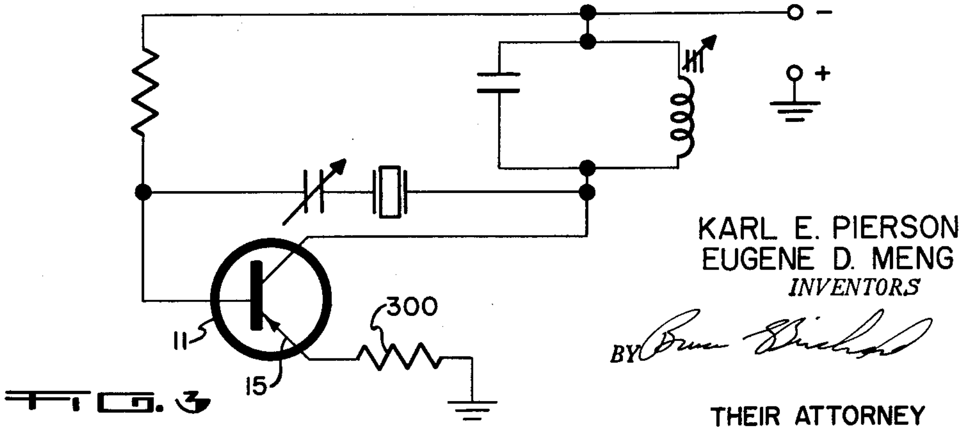
Figure 3 is a schematic diagram of a second modification of the crystal-controlled oscillator circuit shown in Figure 1.

In the circuit of Figure 3, a second modification of the circuit of Figure 1, stabilizing resistor 300 is inserted between emitter 15 of transistor 11 and ground.

The circuit of Figure 3 operates as follows. In the absence of stabilizing resistor 300 in the emitter circuit of transistor 11, a clipping of the negative half-cycles of the oscillator output signal will occur, as previously explained. The inclusion of stabilizing resistor 300 in the emitter circuit of transistor 11 provides a more nearly sinusoidal output wave form, owing to the fact that this resistor will keep the base-to-emitter impedance of transistor 11 fairly constant over the complete cycle.

The present invention operates equally well on P—N—P or N—P—N junction transistors with appropriate attention being paid to the polarity of applied operating potentials; also one transistor may be substituted for another without deleterious effects, despite any marked deviation in parameters between the two transistors.

While particular embodiments of the present invention have been shown and described, it will be obvious to those skilled in the art that changes and modifications may be made without departing from this invention in its broader aspects, and, therefore, the aim in the appended claims is to cover all such change and modifications as fall within the true spirit and scope of this invention.

We claim:

1. A crystal-controlled oscillation harmonic generator including, in combination, a junction-type transistor having emitter, collector and base terminals, a regenerative feedback circuit being coupled between said collector and base terminals of said transistor, said regenerative feedback circuit including a Piezo-electric crystal and a variable capacitor, first and second current input terminals for connection to a source of operating current, a first of said input terminals being adapted to be maintained at a reference potential, a second of said input terminals being adapted to be maintained at a different potential, said emitter of said transistor being coupled to said first input terminal, a resistor being coupled between said second input terminal and said base terminal of said transistor, a stabilizing impedance interposed in the emitter-collector circuit of said transistor, and a parallel resonant circuit having one variable reactance leg, said parallel resonant circuit being coupled between said second input terminal and the junction of said feedback circuit and said collector terminal of said transistor.

2. A crystal-controlled oscillation harmonic generator including, in combination: a junction-type transistor having emitter, collector, and base terminals; a regenerative feedback circuit including a crystal, a variable capacitor, and a plurality of end-terminals; an inductor; a first terminal of said feedback circuit being coupled to said base terminal of said transistor; a second terminal of said feedback circuit being coupled through said inductor to said collector terminal of said transistor; first and second current input terminals for connection to a source of operating current, a first of said input terminals being adapted to be maintained at a reference potential, a second of said input terminals being adapted to be maintained at a different potential; said emitter of said transistor being coupled to said first input terminal; a resistor being coupled between said second input terminal and said base terminal of said transistor; and a parallel resonant circuit having one variable reactance leg and being coupled between said second input terminal and the junction of said inductor and said feedback circuit.

3. A crystal-controlled oscillation harmonic generator including, in combination: a junction-type transistor having emitter, collector, and base terminals; a regenerative feedback circuit including a crystal, a variable capacitor, and a plurality of end-terminals; a variable inductor; a first terminal of said feedback circuit being coupled to said base terminal of said transistor; a second terminal of said feedback circuit being coupled through said variable inductor to said collector terminal of said transistor; first and second current input terminals for connection to a source of operating current, a first of said input terminals being adapted to be maintained at a reference potential, a second of said input terminals being adapted to be maintained at a different potential; said emitter of said transistor being coupled to said first input terminal; a resistor being coupled between said second input terminal and said base terminal of said transistor; and a parallel resonant circuit having one variable reactance leg and being coupled between said second input terminal and the junction of said variable inductor and said feedback circuit.

4. A crystal-controlled transistor oscillator including in combination, a junction-type transistor having emitter, collector and base terminals, a regenerative feedback circuit being coupled between said collector and base terminals of said transistor, said regenerative feedback circuit including a crystal and a variable capacitor, a stabilizing resistor, first and second current input terminals for connection to a source of operating current, a first of said input terminals being adapted to be maintained at a reference potential, a second of said input terminals being adapted to be maintained at a different potential, said emitter of said transistor being coupled through said stabilizing resistor to said first input terminal, a resistor being coupled between said second input terminal and said base terminal of said transistor, and a parallel resonant circuit having one variable reactance leg, said parallel resonant circuit being coupled between said second input terminal and the junction of said feedback circuit and said collector terminal of said transistor.

References Cited in the file of this patent

UNITED STATES PATENTS 2,133,642 Pierce ---------------- Oct. 18, 1938

OTHER REFERENCES

Article, "Junction Transistor Equivalent Circuits and Vacuum Tube Analogy" by Giacolletto; pages 1490–1493 of Nov. 1952, Issue Proceedings of I. R. E.